June 25, 1957 E. G. MILLER, JR 2,797,328
TRANSISTOR OSCILLATOR
Filed March 21, 1956
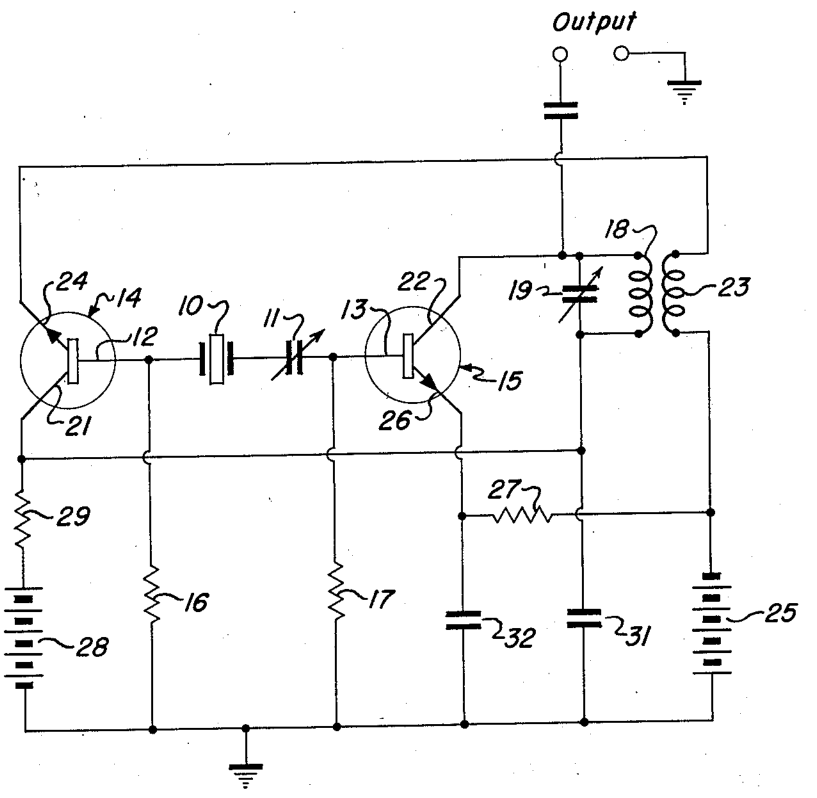
INVENTOR:
Edward G. Miller, Jr.
BY
Roland A. Anderson
Attorney 2,797,328
Patented June 25, 1957

2,797,328

TRANSISTOR OSCILLATOR

Edward G. Miller, Jr., Albuquerque, N. Mex., assignor, by mesne assignments, to the United States of America as represented by the United States Atomic Energy Commission Application March 21, 1956, Serial No. 573,059

5 Claims. (Cl. 250—36)

This invention relates to an oscillator and more particularly to an oscillator utilizing crystal control and transistors in a balanced base-to-base coupled circuit.

The development of the transistor has opened up a new field in electronics. An important feature of the transistor is its characteristics that permit circuits having higher stability than similar circuits employing vacuum tubes. Also, higher impedance and lower current paths can be realized by employing transistors. Because of the type of construction of a transistor, they are relatively free from microphonic noise that is sometimes characteristic in vacuum tubes.

It is well known that a quartz crystal employed as the frequency determining means in an oscillator is far more stable than an inductance-capacitance arrangement. It is also well known that high currents will degrade the Q of a quartz crystal by the heating effect as the current flows through the crystal, resulting in reduced stability of the output frequency of an oscillator. To reduce this high current that may flow through a crystal, is to employ the crystal in a high-impedance circuit.

A secondary frequency standard may be an oscillator whose output is compared to one or more primary frequency standards. In order for an oscillator to be entitled to the rating of a secondary frequency standard, it must have stability and precision, and be essentially independent of temperature variations.

It is accordingly an object of the present invention to provide an oscillator that utilizes a quartz crystal connected between the base electrodes of a pair of transistors to accomplish a high impedance path across the crystal.

Another object of the present invention is to provide an oscillator that utilizes the high resistance of the antiresonant operating mode of a quartz crystal to minimize the internal heating of the crystal structure due to oscillator current flow, thereby increasing the Q of the crystal.

A further object of the present invention is to provide an oscillator capable of producing a highly stable output frequency from a wide variety of quartz crystals.

A still further object of the present invention is to provide an oscillator capable of generating a radio frequency output voltage whose order of frequency stability is suitable for use as a secondary frequency standard.

An oscillator circuit in accordance with the present invention comprises a pair of transistors, each having a collector, an emitter and a base electrode. A crystal, which is the frequency-determining means of the oscillator, is connected between the base terminals of the transistors. There is a tuned antiresonant circuit that comprises an inductance and a capacitance connected in parallel and the combination is connected between the collectors of the transistors. Feedback is provided by an inductance that is coupled to the tuned antiresonant circuit and connected to the emitters. Positive and negative potentials are supplied to the emitters and collectors respectively. An output circuit is connected to an unbypassed collector.

The novel features that are considered characteristic of this invention are set forth with particularity in the appended claims. The invention itself, however, both as to its organization and method of operation, as well as additional objects and advantages thereof, will best be understood from the following description when read in connection with the drawing.

Referring to the drawing, there is illustrated a transistor crystal-controlled oscillator circuit in accordance with the invention, comprising a crystal 10 of a predetermined frequency connected in series with a variable capacitance 11, and the combination is connected between the base terminals 12 and 13 of transistors 14 and 15 respectively. The crystal 10 and variable capacitor 11 make up the frequency-determining means of the oscillator. Capacitor 11 is variable to provide a means of adjusting the oscillator frequency over a predetermined range.

The crystal 10 may be cut for a predetermined frequency, but when employed in a circuit, the circuit capacities may vary the crystal frequency by a few cycles each side of the desired frequency. As stated above, a secondary frequency standard may be an oscillator whose output is compared to one or more primary frequency standards. The variable capacitor 11 provides a means of compensating for variations in the crystal frequency due to the circuit capacities. This adjustment of variable capacitor 11 permits setting of the oscillator's fundamental output frequency to that of a primary frequency standard. When the oscillator's output frequency is equal to the frequency of a primary standard, the oscillator is considered a secondary frequency standard. Biasing potentials in the oscillator for both D. C. and A. C. are developed across resistors 16 and 17.

A circuit comprising inductor 18 and variable capacitor 19 are connected in parallel between the collector electrodes 21 and 22 of transistors 14 and 15. This combination is antiresonant at the oscillator fundamental frequency and develops an A. C. potential across it. Feedback inductor 23 is inductively coupled to the antiresonant circuit. Thus, a portion of the potential developed across the antiresonant circuit appears across this inductor 23 connected between the emitter electrode 24 of transistor 14 and the negative terminal of battery 25. The battery 25 furnishes the proper negative D. C. potential to emitter 24 of transistor 14 through the inductor 23, and it also furnishes the proper D. C. potential to emitter 26 through resistor 27. Battery 28 furnishes a proper positive D. C. potential to collector 21 of transistor 14 through resistor 29, and it also furnishes a potential to collector 22 of transistor 15 through resistor 29 and inductance 18 of the antiresonant circuit. A low impedance path for A. C. currents in the oscillator is provided by capacitor 31 connected between the collector 21 of transistor 14 and ground. Capacitor 32 connected between emitter 26 of transistor 15 and ground also provides a low impedance path to ground.

The oscillator may be better understood by its operation, where if we assume at the moment the biasing voltages are applied, the current flowing through the base electrode 13 of transistor 15 increases, which, in turn, will cause a reduction in potential at the junction between capacitor 11 and resistor 17. Further, this change in current will be amplified and appear as a positive going current pulse at the collector 22 of transistor 15. The positive going current pulse at the collector 22 is then transmitted to the inductor 18 and capacitor 19, which are tuned to antiresonance at the fundamental frequency of the oscillator. The positive going current pulse shocks the inductor 18 and capacitor 19 into oscillation at a frequency equal to the LC of the network which is selected to oscillate at a frequency equal to the crystal frequency. This alternating current flowing in inductor 18 is transmitted by induction to the secondary coil 23, which is closely coupled to coil 18. Coil 23, whose inductive reactance is high at the fundamental frequency, will produce a sinusoidal current equal in frequency to that of the primary. The alternating potential is increased in magnitude, opposite in phase, and is transmitted to the emitter 24 of transistor 14. Here the alternating potential is amplified and appears at the base electrode 12. It should be pointed out that transistor 14 is connected as a grounded collector amplifier which has the capability of current amplification between the emitter and base electrode. Another way of thinking of this transistor 14 circuit is as a backward emitter follower.

In the dynamic condition, if it is considered that the electron flow from terminal of battery 25 through coil 23, through transistor 14 from emitter 24 to the base electrode 12, and through the resistor 16 back to the positive terminal of battery 25, a negative going potential is developed that shocks the crystal 10 into oscillation. At this same time, the negative-going current is further increased by the change in characteristics of collector-base circuit. This is accomplished due to the increased electron flow across the collector-base path. This increase in current across the collector-base, combined with the emitter-base current, results in an increase in potential drop across resistor 16. The negative-going potential step appearing across resistor 16 is of the proper phase and of sufficient magnitude to overcome the resistive losses of crystal 10 and will shock it into oscillation at a frequency close to antiresonance. The combination of crystal 10 and capacitor 11 may be set to the desired frequency by the adjustment of capacitor 11, as described in more detail above.

It will thus be seen that what has been described herein is an oscillator employing crystal control of a base-to-base transistor circuit. Many variations in the arrangement of the system or in the network described will now be apparent to one skilled in the art without departing from the spirit and scope of the invention as defined in the appended claims.

What is claimed is:

1. A crystal-controlled oscillator comprising a pair of transistors each having at least an emitter, a collector and a base electrode, a crystal connected between the base electrodes for controlling the frequency of the oscillator, an antiresonant circuit connected between the collectors and tuned to the crystal frequency, means for supplying positive and negative bias to the collectors and emitters respectively, and negative feedback means coupled to the antiresonant circuit and connected between the emitters.

2. A crystal-controlled oscillator comprising a pair of transistors each having at least an emitter, a collector and a base electrode, a crystal connected between the base electrodes for controlling the frequency of the oscillator, a pair of impedance elements connected individually between each of the base electrodes and ground, thereby to provide a negative resistance looking into the base electrodes, an antiresonant circuit connected between the collectors and tuned to the crystal frequency, means for supplying positive and negative bias to the collectors and emitters respectively, and negative feedback means coupled to the antiresonant circuit and connected between the emitters.

3. A crystal-controlled oscillator comprising a pair of transistors each having at least an emitter, a collector and a base electrode, a crystal connected between the base electrodes for controlling the frequency of the oscillator, a variable capacitor serially connected with the crystal to provide a means of varying the frequency of the oscillator, a pair of impedance elements connected individually between each of the base electrodes and ground, thereby to provide negative resistance looking into the base electrodes, an antiresonant circuit connected between the collectors and tuned to the crystal frequency, means for supplying positive and negative bias to the collector and emitters respectively, and negative feedback means coupled to the antiresonant circuit and connected between the emitters.

4. A crystal-controlled oscillator comprising a pair of transistors each having at least an emitter, a collector and a base electrode, a crystal and variable capacitor serially connected between the base electrodes for controlling the frequency of the oscillator, a pair of resistors connected individually between each of the base electrodes and ground, thereby to provide a negative resistance looking into the base electrodes, an antiresonant circuit including an inductance and a variable capacitance forming a parallel network connected between the collectors and tuned to the crystal frequency, means for supplying positive and negative bias to the collectors and emitters respectively, and negative feedback means coupled to the antiresonant circuit and connected between the emitters.

5. A crystal-controlled oscillator comprising a first and second transistor having each at least an emitter, a collector and a base electrode, a crystal and a variable capacitor connected serially between the base electrodes for controlling the frequency of the oscillator, a pair of resistors connected individually between each of the base electrodes and ground, thereby to provide a negative resistance looking into the base electrodes, an antiresonant circuit including an inductance and a variable capacitor forming a parallel network connected between the collectors and tuned to the crystal frequency, a first source of potential having one terminal grounded and supplying positive potential to the collector of the first transistor through a resistor and supplying a positive potential to the collector of the second transistor through a resistor and the antiresonant network, an inductance coupled to the antiresonant network and connected between the emitters to provide negative feedback to the emitter of the first transistor, a second source of potential having one terminal grounded to supply a negative potential to the emitter of the second transistor through a resistor and to supply a negative potential to the emitter of he first transistor through the feedback inductance, and output means connected to the collector of the second transistor.

References Cited in the file of this patent

UNITED STATES PATENTS

| | | |
|---|---|---|
| 2,755,384 | Pierson et al. | July 17, 1956 |
| 2,764,687 | Buchanan | Sept. 25, 1956 |